US011183536B2

(12) United States Patent
Li

(10) Patent No.: US 11,183,536 B2
(45) Date of Patent: Nov. 23, 2021

(54) DISPLAY PANEL, REPAIR METHOD OF DISPLAY PANEL, AND DISPLAY DEVICE

(71) Applicant: Shanghai Tianma Micro-Electronics Co., Ltd., Shanghai (CN)

(72) Inventor: Fei Li, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 1 day.

(21) Appl. No.: 16/231,864

(22) Filed: Dec. 24, 2018

(65) Prior Publication Data
US 2020/0035750 A1    Jan. 30, 2020

(30) Foreign Application Priority Data

Jul. 27, 2018 (CN) .......................... 201810847557.7

(51) Int. Cl.
| | |
|---|---|
| *H01L 27/15* | (2006.01) |
| *G09G 3/32* | (2016.01) |
| *H01L 25/16* | (2006.01) |
| *H01L 27/12* | (2006.01) |
| *H01L 33/62* | (2010.01) |

(52) U.S. Cl.
CPC ............. *H01L 27/156* (2013.01); *G09G 3/32* (2013.01); *H01L 25/167* (2013.01); *H01L 27/1214* (2013.01); *H01L 33/62* (2013.01)

(58) Field of Classification Search
CPC .................................................. H01L 27/156
See application file for complete search history.

(56) References Cited

U.S. PATENT DOCUMENTS

| | | | | |
|---|---|---|---|---|
| 8,791,474 B1* | 7/2014 | Bibl | ...................... | G09G 3/3208 257/89 |
| 8,987,765 B2* | 3/2015 | Bibl | ................... | H01L 25/0753 257/98 |
| 9,240,397 B2* | 1/2016 | Bibl | ........................ | H01L 33/60 |
| 2014/0267683 A1* | 9/2014 | Bibl | ........................ | G09G 3/006 348/87 |

(Continued)

FOREIGN PATENT DOCUMENTS

| | | |
|---|---|---|
| CN | 105324858 A | 2/2016 |
| CN | 106684098 A | 5/2017 |
| CN | 107507926 A | 12/2017 |

*Primary Examiner* — Abul Kalam
(74) *Attorney, Agent, or Firm* — Anova Law Group, PLLC

(57) ABSTRACT

Display panel, repair method, and display device are provided. The display panel includes: a base substrate; an array substrate including driving thin film transistors (TFTs); first electrodes connected to the TFTs in a one-to-one correspondence; a light-emitting structure including first light-emitting diodes (LEDs) and second LEDs; a second electrode; and one of first and second insulating layers. In each sub-pixel unit, a first LED electrode and a third LED electrode of a first LED is connected to a corresponding first electrode and the second electrode, respectively; the first insulating layer is formed between a second LED electrode of a second LED and the corresponding first electrode, and a fourth LED electrode of the second LED is connected to the second electrode; and the second insulating layer is formed between the fourth LED electrode and the second electrode, and the second LED electrode is connected to the corresponding first electrode.

13 Claims, 11 Drawing Sheets

(56) References Cited

U.S. PATENT DOCUMENTS

| | | | |
|---|---|---|---|
| 2014/0367705 A1* | 12/2014 | Bibl | ......................... H01L 33/60 |
| | | | 257/88 |
| 2015/0187249 A1* | 7/2015 | Tani | ..................... G09G 3/2003 |
| | | | 345/694 |
| 2016/0111405 A1* | 4/2016 | Bibl | ......................... H01L 33/62 |
| | | | 257/13 |
| 2017/0125392 A1* | 5/2017 | Bibl | ......................... H01L 33/60 |
| 2018/0102492 A1* | 4/2018 | Bibl | ......................... H01L 51/50 |
| 2019/0148611 A1* | 5/2019 | He | ......................... H01L 25/167 |
| | | | 257/72 |

* cited by examiner

DISPLAY PANEL, REPAIR METHOD OF DISPLAY PANEL, AND DISPLAY DEVICE

CROSS-REFERENCES TO RELATED APPLICATION

This application claims the priority of Chinese Patent Application No. 201810847557.7, filed on Jul. 27, 2018, the content of which is incorporated herein by reference in its entirety.

TECHNICAL FIELD

The present disclosure generally relates to the field of display technology and, more particularly, relates to a display panel, a repair method of the display panel, and a display device.

BACKGROUND

With a continuous development of technologies for micro-light-emitting diodes (Micro LEDs) and sub-millimeter light-emitting diodes (Mini LEDs), Micro LEDs and Mini LEDs are widely used in display devices. Among them, an active matrix/micro light emitting diode (AM Micro LED) has incomparable advantages in a display quality and a display performance, compared to a TFT LCD. In the display performance, the AM Micro LED has a higher response speed, a higher contrast ratio, and a wider viewing angle. Moreover, the AM Micro LED has a feature of self-illuminating, therefore no backlight is needed. Correspondingly, the AM Micro LED can be thinner and lighter than the TFT LCD, and also can save more electricity. The AM Micro LED is viewed as a next-generation display technology.

Currently, how to improve a success rate of repair of the display panels becomes an urgent problem to be solved in the display technologies.

The disclosed display panel, repair method and display device are directed to solve one or more problems set forth above and other problems.

SUMMARY

One aspect of the present disclosure provides a display panel. The display panel configured with a display area and a non-display area surrounding the display area, the display area being configured with a plurality of pixel units, and each pixel unit including a plurality of sub-pixel units, includes: a base substrate; an array substrate including a plurality of driving thin film transistors; first electrodes electrically connected to first terminals of the plurality of driving thin film transistors in a one-to-one correspondence; a light-emitting structure including first light-emitting diodes and second light-emitting diodes; a second electrode, disposed on a side of the light-emitting structure away from the array substrate; and one of a first insulating layer and a second insulating layer. In each sub-pixel unit, a first LED electrode of a first light-emitting diode is electrically connected to a corresponding first electrode and a third LED electrode of the first light-emitting diode is electrically connected to the second electrode; the first insulating layer is formed between a second LED electrode of a second light-emitting diode and the corresponding first electrode, and a fourth LED electrode of the second light-emitting diode is electrically connected to the second electrode; and the second insulating layer is formed between the fourth LED electrode of the second light-emitting diode and the second electrode, and the second LED electrode of the second light-emitting diode is electrically connected to the corresponding first electrode.

Another aspect of the present disclosure provides a repair method of a display panel. The display panel configured with a display area and a non-display area surrounding the display area, the display area being configured with a plurality of pixel units, and each pixel unit including a plurality of sub-pixel units, includes: a base substrate; an array substrate including a plurality of driving thin film transistors; first electrodes electrically connected to first terminals of the plurality of driving thin film transistors in a one-to-one correspondence; a light-emitting structure including first light-emitting diodes and second light-emitting diodes; a second electrode, disposed on a side of the light-emitting structure away from the array substrate; and one of a first insulating layer and a second insulating layer. In each sub-pixel unit, a first LED electrode of a first light-emitting diode is electrically connected to a corresponding first electrode and a third LED electrode of the first light-emitting diode is electrically connected to the second electrode; the first insulating layer is formed between a second LED electrode of a second light-emitting diode and the corresponding first electrode, and a fourth LED electrode of the second light-emitting diode is electrically connected to the second electrode; and the second insulating layer is formed between the fourth LED electrode of the second light-emitting diode and the second electrode, and the second LED electrode of the second light-emitting diode is electrically connected to the corresponding first electrode. The repair method includes: determining whether a first light-emitting diode in each sub-pixel unit of the plurality of the sub-pixels has a short circuit or an open circuit; when the first light-emitting diode has the open circuit, using a laser irradiation process to melt and cut off the one of the first insulating layer and the second insulating layer, to electrically connect the at least one second light-emitting diode with the corresponding first electrode and with the second electrode respectively; and when the first light-emitting diode has the short circuit, using the laser irradiation process to cut off an electrical connection between the first light-emitting diode and the at least one second light-emitting diode, and also using the laser irradiation process to melt and cut off the one of the first insulating layer and the second insulating layer, to electrically connect the at least one second light-emitting diode with the corresponding first electrode and with the second electrode respectively.

Another aspect of the present disclosure provides a display device. The display device includes a display panel configured with a display area and a non-display area surrounding the display area, the display area being configured with a plurality of pixel units, and each pixel unit including a plurality of sub-pixel units, includes: a base substrate; an array substrate including a plurality of driving thin film transistors; first electrodes electrically connected to first terminals of the plurality of driving thin film transistors in a one-to-one correspondence; a light-emitting structure including first light-emitting diodes and second light-emitting diodes; a second electrode, disposed on a side of the light-emitting structure away from the array substrate; and one of a first insulating layer and a second insulating layer. In each sub-pixel unit, a first LED electrode of a first light-emitting diode is electrically connected to a corresponding first electrode and a third LED electrode of the first light-emitting diode is electrically connected to the second electrode; the first insulating layer is formed between a second LED electrode of a second light-emitting diode and the corresponding first electrode, and a fourth LED electrode of the second light-emitting diode is electrically connected to the second electrode; and the second insulating layer is formed between the fourth LED electrode of the second light-emitting diode and the second electrode, and the second LED electrode of the second light-emitting diode is electrically connected to the corresponding first electrode.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
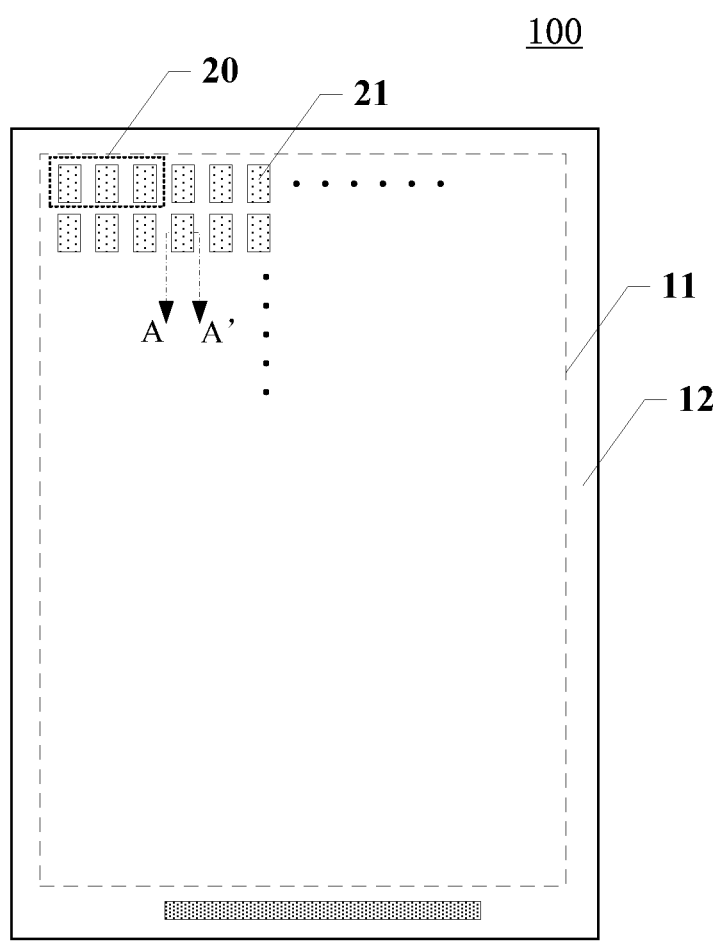
FIG. 1 illustrates a top view of an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the invention. Furthermore, a three-dimensional (3D) size including length, width and depth should be considered during practical fabrication.

An active matrix/micro light emitting diode (AM Micro LED) has incomparable advantages in a display quality and a display performance, compared to a TFT LCD. In the display effects and performances, the AM Micro LED has a higher response speed, a higher contrast ratio, and a wider viewing angle. Moreover, the AM Micro LED has a feature of self-illuminating, therefore no backlight is needed. Correspondingly, the AM Micro LED can be thinner and lighter than the TFT LCD, and also can save more electricity. The AM Micro LED is regarded as a next-generation display technology. Currently how to improve a success rate of repair of the display panels becomes an urgent problem to be solved in the display technologies.

The present disclosure provides a display panel, a repair method of the display panel, and a display device. In a display panel provided by various embodiments of the present disclosure, each sub-pixel unit of the plurality of the sub-pixel units may include a first light-emitting diode and at least one second light-emitting diode. When the first light-emitting diode behaves abnormally, the at least one second light-emitting diode may perform a display function instead. A success rate of repairing the display panel may be improved and a cost of the display panel may be reduced.

The present disclosure provides a display panel. The display panel may be configured with a display area and a non-display area surrounding the display area. The display area may include a plurality of pixel units, and each pixel unit may include a plurality of sub-pixel units.

The display panel may include: a base substrate; an array substrate, disposed on the base substrate and including a plurality of driving thin film transistors; a plurality of first electrodes, disposed on a side of the array substrate away from the base substrate and electrically connected to first terminals of the plurality of driving thin film transistors in a one-to-one correspondence; a light-emitting structure, disposed on a side of the plurality of the first electrodes that is away from the base substrate, wherein the light-emitting structure includes a plurality of first light-emitting diodes and a plurality of second light-emitting diodes; a second electrode, disposed on a side of the light-emitting structure away from the array substrate; and one of a first insulating layer and a second insulating layer. First LED electrodes of the plurality of the first light-emitting diodes and second LED electrodes of the plurality of the second light-emitting diodes may be disposed adjacent to the array substrate. Third LED electrodes of the plurality of the first light-emitting diodes and fourth LED electrodes of the plurality of the second light-emitting diodes may be disposed away from the array substrate. Each sub-pixel unit of the plurality of the sub-pixel units may include a driving thin film transistor, a first light-emitting diode, and at least one second light-emitting diode. In each sub-pixel unit of the plurality of the sub-pixel units, a first LED electrode of the first light-emitting diode may be electrically connected to the corresponding first electrode and the third LED electrode of the first light-emitting diode may be electrically connected to the second electrode. The first insulating layer may be disposed between a second LED electrode of the at least one second light-emitting diode and the corresponding first electrode of the plurality of the first electrodes, and a fourth LED electrode of the at least one second light-emitting diode may be electrically connected to the second electrode; the second insulating layer may be formed between the fourth LED electrode of the at least one second light-emitting diode and the second electrode, and the second LED electrode of the at least one second light-emitting diode may be electrically connected to the corresponding first electrode of the plurality of the first electrodes.

Figure 2:
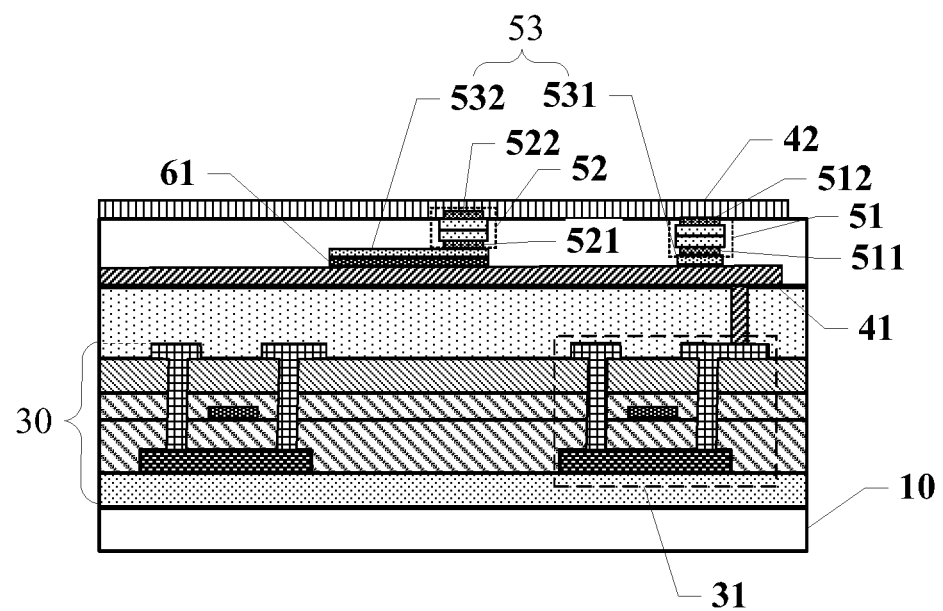
FIG. 2 illustrates a cross-section view of an exemplary structure of the display panel in FIG. 1 along an AA' direction, consistent with various disclosed embodiments in the present disclosure.

FIGS. 1-2 illustrate a structure of an exemplary display panel consistent with various disclosed embodiments in the present disclosure. FIG. 1 is a top view and FIG. 2 is a cross-section view along an A-A' direction in FIG. 1. A display panel 100 may be provided. The display panel 100 may include a display area 11 and a non-display area 12. The display area may 11 include a plurality of pixel units 20, and each pixel unit 20 may include a plurality of sub-pixel units 21.

The display panel 100 may include: a base substrate 10; an array substrate 30, disposed on the base substrate 10 including a plurality of driving thin film transistors 31; a plurality of first electrodes 41, disposed on a side of the array substrate 30 away from the base substrate 10; a light-emitting structure, disposed on a side of the plurality of the first electrodes away from the base substrate; a second electrode 42, disposed on a side of the light-emitting structure away from the array substrate 30; and a first insulating layer. The plurality of the first electrodes 41 on the array substrate 30 may be electrically connected to first terminals of the plurality of the driving thin film transistors 31 in a one-to-one correspondence. The light-emitting structure may include a plurality of first light-emitting diodes 51 and a plurality of second light-emitting diodes 52. First LED electrodes 511 of the plurality of the first light-emitting diodes 51 and second LED electrodes 521 of the plurality of the second light-emitting diodes 52 may be disposed close to the array substrate 30, while third LED electrodes 512 of the plurality of the first light-emitting diodes 51 and fourth LED electrodes 522 of the plurality of the second light-emitting diodes 52 may be disposed away from the array substrate 30. Each sub-pixel unit of the plurality of the sub-pixel units 21 may include a driving thin film transistor 31, a first light-emitting diode 51, and at least one second light-emitting diode 52. In each sub-pixel unit 21 of the plurality of the sub-pixel units 21, a first LED electrode 511 of the first light-emitting diode 51 may be electrically connected to a corresponding first electrode 41 and a third LED electrode 512 of the first light-emitting diode 51 may be electrically connected to the second electrode 42. The first insulating layer 61 may be disposed between a second LED electrode 521 of the at least one second light-emitting diode and the corresponding first electrode of the plurality of the first electrodes 41, and a fourth LED electrode 522 of the at least one second light-emitting diode may be electrically connected to a second electrode 42.

FIG. 2 illustrates a relative position relationship of the light-emitting diodes and the driving thin film transistors 31 in one sub-pixel unit 21 of the plurality of the sub-pixel units 21 in the display panel. FIG. 2 uses the display panel where each sub-pixel unit of the plurality of the sub-pixel units 21 includes a light-emitting diode 51 and a second light-emitting diode 51 as an example. This should not limit a scope of the present disclosure. In some embodiments, each sub-pixel unit of the plurality of the sub-pixel units 21 may include a plurality of the second light-emitting diodes 52. When the first light-emitting diode 51 has a problem and cannot display normally, a second light-emitting diode 52 of the plurality of second light-emitting diode 52 in the corresponding sub-pixel 21 may be used to display. When this second light-emitting diode 52 has a problem and cannot display normally, one of other second light-emitting diodes 52 of the plurality of the second light-emitting diode 52 may be used to display. The present disclosure uses the display panel where each sub-pixel unit of the plurality of the sub-pixel units 21 includes a light-emitting diode 51 and a second light-emitting diode 51 as an example for description purpose only, and have no limit on this.

As illustrated in FIG. 2, in one embodiment, in each sub-pixel unit 21, the first LED electrode 511 of the first light-emitting diode 51 and the third LED electrode 512 of the first light-emitting diode 51 may be electrically connected to the corresponding first electrode of the plurality of the first electrodes 41 and the second electrode 42 respectively. When one sub-pixel unit 21 is required to emit light, the first light-emitting diode 51 may be preferentially activated to emit light. The first insulating layer 61 may be disposed between the second LED electrode 521 of the second light-emitting diode 52 and the corresponding first electrode of the plurality of the first electrodes 41, and the fourth LED electrode 522 of the second light-emitting diode 52 may be electrically connected with the second electrode 42. Subsequently, in an initial condition, the second light-emitting diode 52 may be not connected to the corresponding first electrode of the plurality of the first electrodes 41 and the second electrode 42. When the first light-emitting diode 51 has a problem such as an open circuit and cannot emit light normally, a laser irradiation process may be used to melt and cut off the first insulating layer 61 between the second LED electrode 521 of the second light-emitting diode 52 and the corresponding first electrode of the plurality of the first electrodes 41. Subsequently, the second LED electrode 521 of the second light-emitting diode 52 may be electrically connected to the corresponding first electrode of the plurality of the first electrodes 41, and the second light-emitting diode 52 may be electrically connected to the corresponding first electrode of the plurality of the first electrodes 41 and the second electrode 42. Correspondingly the second light-emitting diode 52 may emit light. When the first light-emitting diode 51 cannot emit light normally because of a shorted circuit, an electrical connection between the first light-emitting diode 51 and the second light-emitting diode 52 may be cut off, when using the laser irradiation process to electrically connect the second light-emitting diode 52 with the corresponding first electrode of the plurality of the first electrodes 41 and with the second electrode 42. For example, a part of the second electrode 42 between the first light-emitting diode 51 and the second light-emitting diode 52 may be cut off. A laser irradiation process may also be used to irradiate the abnormal first light-emitting diode 51, to cut off the electrical connection between the first light-emitting diode 51 and the second light-emitting diode 52. The present disclosure has no limit on this.

In one embodiment, the laser may be generated by a laser generator, and the first light-emitting diode 51 and the second light-emitting diode 52 may be Micro LEDs or Mini LEDs. A Micro LED technology may be a high-density array of micro-size LEDs integrated into a chip where a distance between two adjacent pixels may be reduced to a micrometer level from a millimeter level. A Mini LED may be a LED with a crystallite size of 100 micrometers.

In one embodiment, in the first light-emitting diode 51, the first LED electrode 511 may be a cathode, and the third LED electrode 512 may be an anode; in the second light emitting diode 52, the second LED electrode 521 may be a cathode, and the fourth LED electrode 522 may be an anode. In other embodiments, in the first light-emitting diode 51, the first LED electrode 511 may be an anode, and the third LED electrode 512 may be a cathode; in the second light emitting diode 52, the second LED electrode 521 may be an anode, and the fourth LED electrode 522 may be a cathode.

In one embodiment, the display panel 100 may further include a third electrode 53 between the corresponding first electrode of the plurality of the first electrodes 41 and the first light emitting diode 51, and between the corresponding first electrode of the plurality of the first electrodes 41 and the second light-emitting diode 52, in each sub-pixel unit of the plurality of the sub-pixel units. The third electrode 53 may include a third A electrode 531 electrically connected to the first LED electrode 511 of the first light-emitting diode 51, and a third B electrode 532 electrically connected to the second LED electrode 521 of the second light-emitting diode 52. The third A electrode 531 may be in contact with the corresponding first electrode of the plurality of the first electrodes, and the first insulating layer 61 may be disposed between the third B electrode 532 and the corresponding first electrode of the plurality of the first electrodes 41.

The first LED electrode 511 of the first light-emitting diode 51 may be electrically connected to the corresponding first electrode of the plurality of the first electrodes 51 through the third A electrode 531. The first insulating layer 61, and the third B electrode 532 on a side of the first insulating layer 61 away from the corresponding first electrode of the plurality of the first electrodes 41, may be disposed between the second LED electrode 521 of the second light-emitting diode 52 and the corresponding first electrode of the plurality of the first electrodes 41. The third B electrode 532 may be electrically connected to the second LED electrode 521 of the second light-emitting diode 52.

Figure 3:
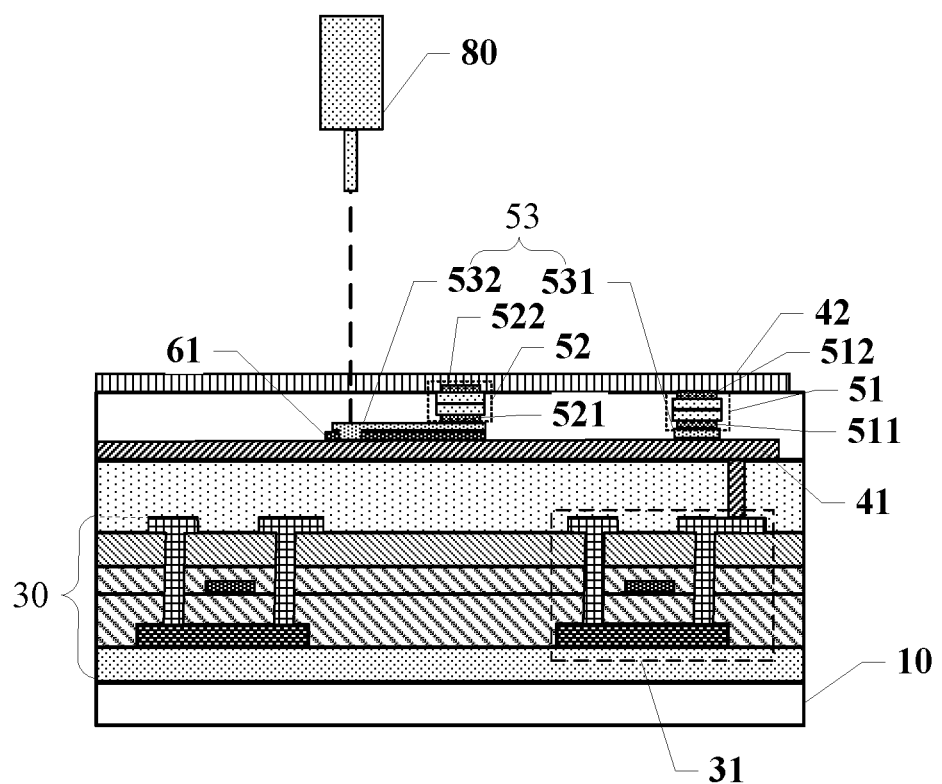
FIG. 3 illustrates a structure of the display panel in FIG. 2 where a third B electrode is electrically connected to a first electrode by a laser radiation from a laser generator.
Figure 4:
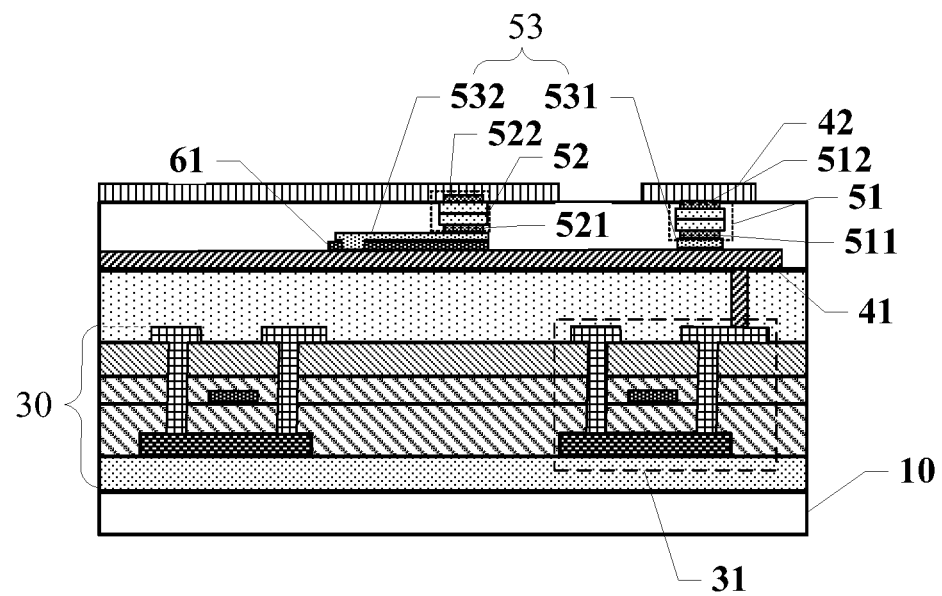
FIG. 4 illustrates a cross-section view of the display panel in FIG. 3 after cutting off a second electrode shared by a first light-emitting diode and a second light-emitting electrode.
Figure 5:
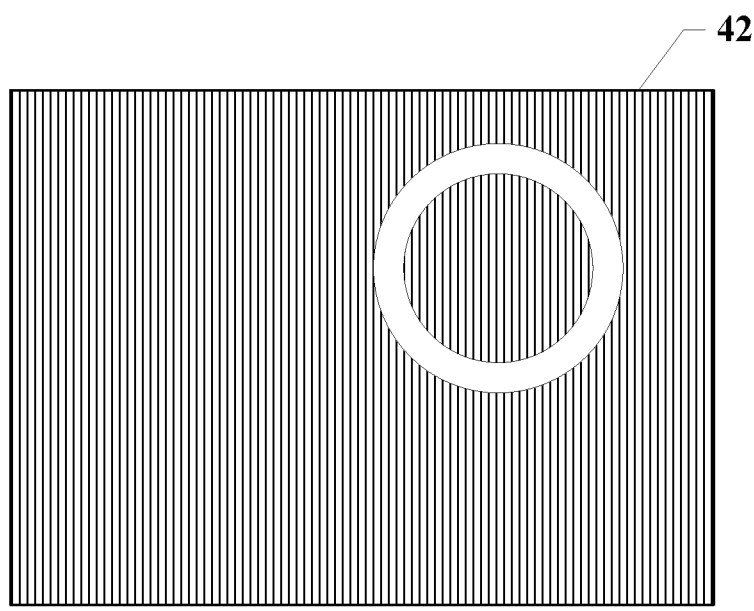
FIG. 5 illustrates a top view of the display panel in FIG. 3 after cutting off a second electrode shared by a first light-emitting diode and a second light-emitting electrode.

When the first light-emitting diode 51 has a problem such as an open circuit and cannot emit light normally, a laser irradiation may be used to irradiate the third B electrode and the first insulating layer 61. A part of the first insulating layer 61 irradiated by the laser irradiation process may melt and evaporate, while a part of the third B electrode 532 irradiated by the laser irradiation process may melt and flow into a position of the evaporated part of the first insulating layer 61 irradiated by the laser irradiation process. Subsequently, the third B electrode 532 may contact the corresponding first electrode of the plurality of the first electrodes 41. FIG. 3 illustrates a structure of the display panel in FIG. 2 after that a part of the third B electrode 532 is irradiated by the laser irradiation process and is electrically connected to the corresponding first electrode of the plurality of the first electrodes 41. Subsequently, the second LED electrode 521 of the second light-emitting diode 52 may be electrically connected to the corresponding first electrode of the plurality of the first electrodes 41, and the second light-emitting diode 52 may be electrically connected to the corresponding first electrode of the plurality of the first electrodes 41 and the second electrode 42 respectively. Correspondingly the second light-emitting diode 52 may substitute the abnormal first light-emitting diode 51 to emit light. When the first light-emitting diode 51 cannot emit light normally because of a shorted circuit, a part of the second electrode electrically connecting the first light-emitting diode 51 with the second light-emitting diode 52 may be cut off by the laser irradiation process, when using the laser irradiation process to electrically connect the second light-emitting diode 52 with the corresponding first electrode of the plurality of the first electrodes 41 and with the second electrode 42. FIG. 4 illustrates a cross-section view along an A-A' direction of the display panel in FIG. 2 after cutting off the second electrode 42 electrically connecting the first light-emitting electrode 51 with the second light-emitting electrode 52, and FIG. 5 illustrates a top view along an A-A' direction of the display panel in FIG. 2 after cutting off the second electrode 42 electrically connecting the first light-emitting electrode 51 to the second light-emitting electrode 52. When it is necessary to cut off the electrical connection between the first light-emitting electrode 51 and the second light-emitting electrode 52, the laser irradiation process may be used to irradiate a part of the second electrode 42 surrounding the abnormal first light-emitting electrode 51, to melt the part of the second electrode 42 and to separate the first light-emitting electrode 51 from the second light-emitting electrode 52. In other embodiments, the abnormal first light-emitting diode 51 may be irradiated directly by the laser irradiation process, to make the first light-emitting electrode 51 being separated from the second light-emitting electrode 52.

In one embodiment, as shown in FIG. 2, in a same sub-pixel unit 21, an area of an orthographic projection of the third B electrode 532 on a plane of the base substrate 10, and an area of the orthographic projection of the first insulating layer 62 on the plane of the base substrate 10, may be larger than an area of the orthographic projection of second LED electrode 521 on the plane of the base substrate 10. In a view angle of FIG. 2, a width of the third B electrode 532 and a width of the first insulating layer 61 may be larger than a width of the second light-emitting diode 52. When the third B electrode 532 and the first insulating layer 61 are radiated by the laser, the radiation area may avoid an overlap area between the second light-emitting diode 52, the third B electrode 532 and the first insulating layer 61. Only a part of the third B electrode 532 and a part of the first insulating layer 61 exceeding the second light-emitting diode 52 may be radiated by the laser. Subsequently, damages on the second light-emitting diode 52 by the laser radiation may be avoided, and the third B electrode 532 may be electrically connected to the corresponding first electrode of the plurality of the first electrodes 41 in a simplified manner. Then the second light-emitting diode 52 may be electrically connected to the corresponding first electrode of the plurality of the first electrodes 41, and to the second electrode 42 respectively.

In one embodiment, the second electrode 42 and the third B electrode 532 may be transparent electrodes. Subsequently, in the laser irradiation process, the laser may penetrate the transparent second electrode 42 to irradiate the area of the third B electrode 532, and may also penetrate the transparent third B electrode 532 to irradiate the area of the first insulating layer 61. When irradiating the third B electrode 532 and the first insulating layer 61, the energy of the laser may be focused on the area of the third B electrode 532 and the area of the first insulating layer 61 by adjusting a laser generator 80, to avoid damages on the second electrode 42.

In one embodiment, the second electrode 42 may be a full-surface electrode corresponding to the display area 11, i.e., each sub-pixel unit of the plurality of the sub-pixel units 21 in the display area 11 may use the same full-surface electrode as the second electrode 42. When forming the second electrode 42, it may be unnecessary to form a second electrode 42 for each sub-pixel unit of the plurality of the sub-pixel units 21 and forming a full-surface electrode may complete forming the second electrode 42 for each sub-pixel unit of the plurality of the sub-pixel units 21. A process for forming the display panel 100 may be reduced and a producing efficiency may be improved.

Figure 6:
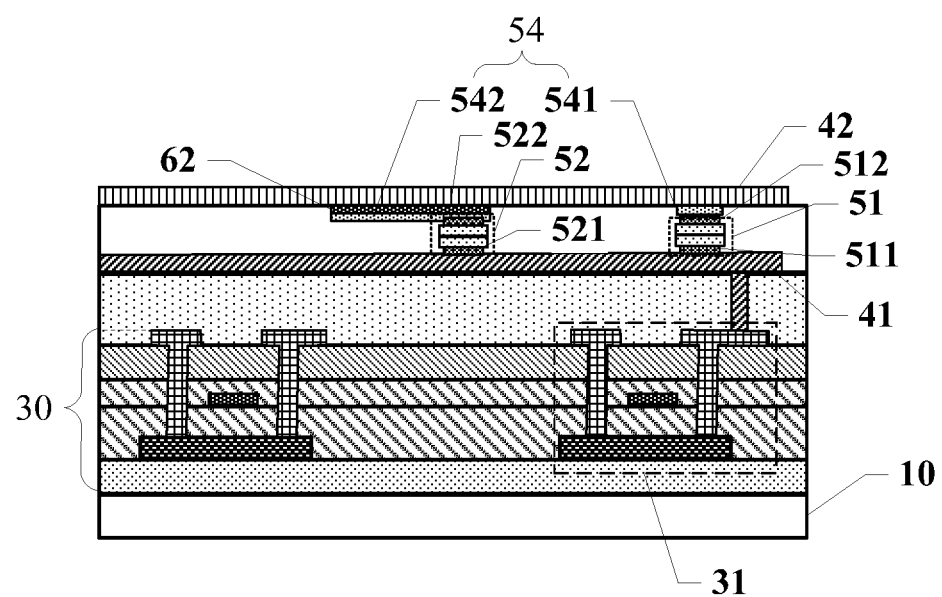
FIG. 6 illustrates a cross-section view of another exemplary structure of the display panel in FIG. 1 along an AA' direction.

FIG. 6 illustrates a cross-section view along an A-A' direction for another structure of display panel in FIG. 1 consistent with various embodiments of the present disclosure. In one embodiment, a second insulating layer 62 may be disposed between the fourth LED electrode 522 of the second light-emitting diode 52 and the second electrode 42 of the second light-emitting diode 52, and the second LED electrode 521 of the second light-emitting diode 52 may be electrically connected to the corresponding first electrode of the plurality of the first electrodes 41. Other aspects of the structure of the display panel may be the same as the previous descriptions. The display panel 100 may further include a fourth electrode 54 between the second electrode 42 and the first light-emitting diode 51, and between the second electrode 42 and the second light-emitting diode 52. The fourth electrode 54 may include a fourth A electrode 541 electrically connected to the third LED electrode 512 of the first light-emitting diode 51, and a fourth B electrode 542 of the second light-emitting diode 52 may be electrically connected to the fourth LED electrode 522. The fourth A electrode 541 may be in contact with the second electrode 42 directly, and the second insulating layer 62 may be disposed between the fourth B electrode 542 and the second electrode 42.

Figure 7:
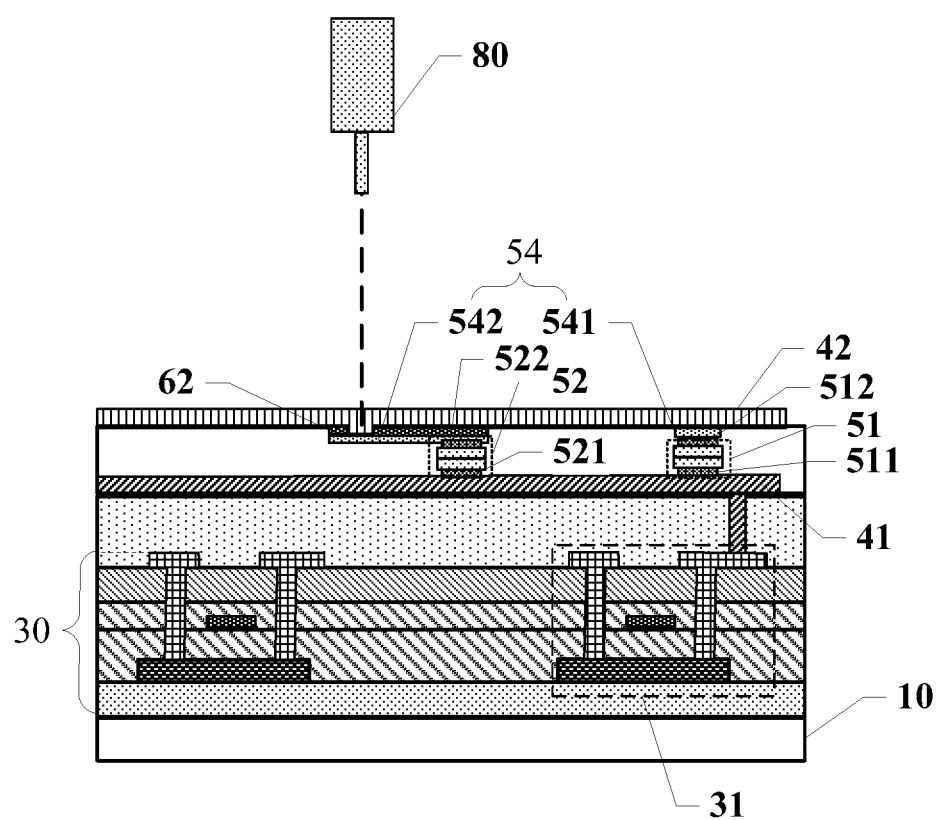
FIG. 7 illustrates an exemplary structure of the display panel in FIG. 6 where a fourth B electrode is electrically connected to a second electrode by a laser radiation process from a laser generator.

In one embodiment, both the first LED electrode 511 of the first light-emitting diode 51 and the second LED electrode 521 of the second light-emitting diode 52 may be electrically connected to the corresponding first electrode of the plurality of the first electrodes 41. The fourth B electrode 542 on a side of the second insulating layer 62 close to the base substrate 10, and the second insulating layer 62, may be formed between the fourth LED electrode 522 of the second light-emitting diode 52 and the second electrode. Subsequently, in an initial condition, the first light-emitting diode 51 may be electrically connected to the corresponding first electrode of the plurality of the first electrodes 41 and the second electrode 42, while the second light-emitting diode 52 may be not electrically connected to the corresponding first electrode of the plurality of the first electrodes 41 and the second electrode 42. When the first light-emitting diode 51 has a problem such as an open circuit and cannot emit light normally, a laser irradiation process may be used to irradiate a part of the second electrode 42 corresponding to the fourth B electrode 542. A part of the first insulating layer 61 irradiated by the laser irradiation process may melt and evaporate, while a part of the second electrode 42 irradiated by the laser irradiation process may melt and flow into a position of the evaporated part of the first insulating layer 61 irradiated by the laser irradiation process. Then the second electrode 42 may be in contact with the fourth B electrode 542. FIG. 7 illustrates a structure of the display panel in FIG. 6 where the laser irradiation process is used to electrically connect the second electrode 42 with the fourth B electrode 542. Subsequently, the second light-emitting diode 52 may be electrically connected to the corresponding first electrode of the plurality of the first electrodes 41 and the second electrode 42 respectively. Correspondingly the second light-emitting diode 52 may substitute the abnormal first light-emitting diode 51 to emit light. A process for repairing the sub-pixel units 21 may be simplified, and a success rate of repair the sub-pixel units 21 may be improved. A cost for the display panel may be reduced.

Figure 8:
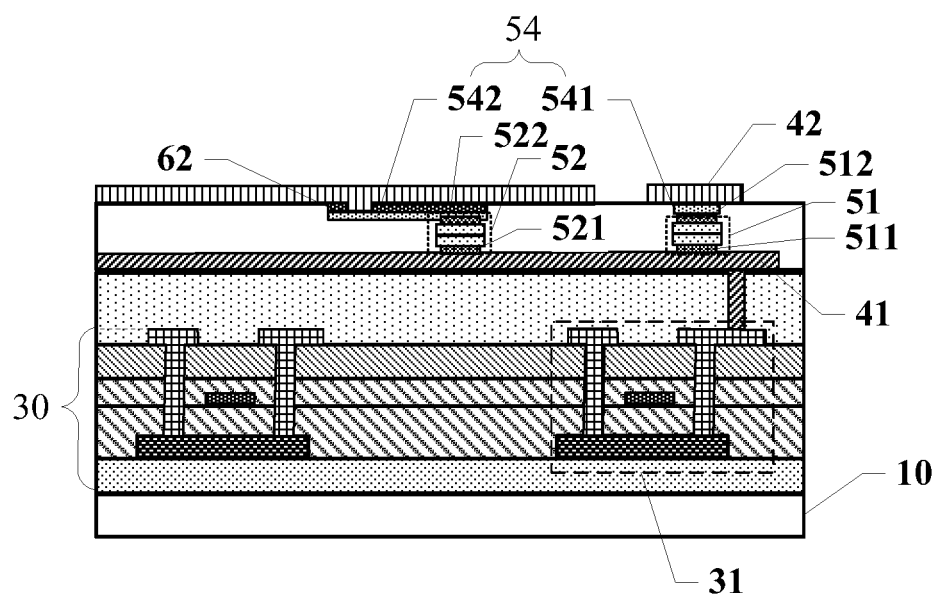
FIG. 8 illustrates an exemplary structure of the display panel in FIG. 7 after cutting off a second electrode shared by a first light-emitting diode and a second light-emitting electrode.

When the first light-emitting diode 51 cannot emit light normally because of a short circuit, the electrical connection between the first light-emitting diode 51 and the second light-emitting diode 52 may be cut off by the laser irradiation process, when using the laser irradiation process to electrically connect the second light-emitting diode 52 with the corresponding first electrode of the plurality of the first electrodes 41 and with the second electrode 42. For example, a part of the second electrode 42 electrically connecting the first light-emitting diode 51 and the second light-emitting diode 52 may be cut off by the laser irradiation process. FIG. 8 illustrates a structure of the display panel in FIG. 7 after cutting off the part of the second electrode 42 electrically connecting the first light-emitting diode 51 and the second light-emitting diode 52. In other embodiments, a laser irradiation process may be used to irradiate the first light-emitting diode 51 directly, to disconnect the first light-emitting diode 51 from the second light-emitting diode 52. The present disclosure has no limit on this.

In one embodiment, as shown in FIG. 6, in each sub-pixel unit 21, an area of the orthographic projection of the fourth B electrode 542 on a plane of the base substrate 10, and an area of the orthographic projection of the second insulating layer 62 on the plane of the base substrate 10, may be larger than an area of the orthographic projection of fourth LED electrode 522 on the plane of the base substrate 10. In a view angle of FIG. 6, a width of the fourth B electrode 542 and a width of the second insulating layer 62 may be larger than a width of the second light-emitting diode 52. When the fourth B electrode 542 and the second insulating layer 62 are radiated by the laser, the radiation area may avoid an overlap area between the second light-emitting diode 52, the fourth B electrode 542 and the second insulating layer 62. Only a part of the fourth B electrode 542 and the second insulating layer 62 exceeding the second light-emitting diode 52 may be radiated by the laser. Subsequently, damages on the second light-emitting diode 52 by the laser radiation may be avoided, and the fourth B electrode 542 may be electrically connected to the second electrode 42 in a simple manner. The second light-emitting diode 52 may be electrically connected to the corresponding first electrode of the plurality of the first electrodes 41, and to the second electrode 42 respectively.

In one embodiment, the second electrode 42 may be a transparent electrode. The laser may penetrate the second electrode 42, and irradiate the second insulating layer 62, to melt and evaporate the second insulating layer 62.

Figure 9:
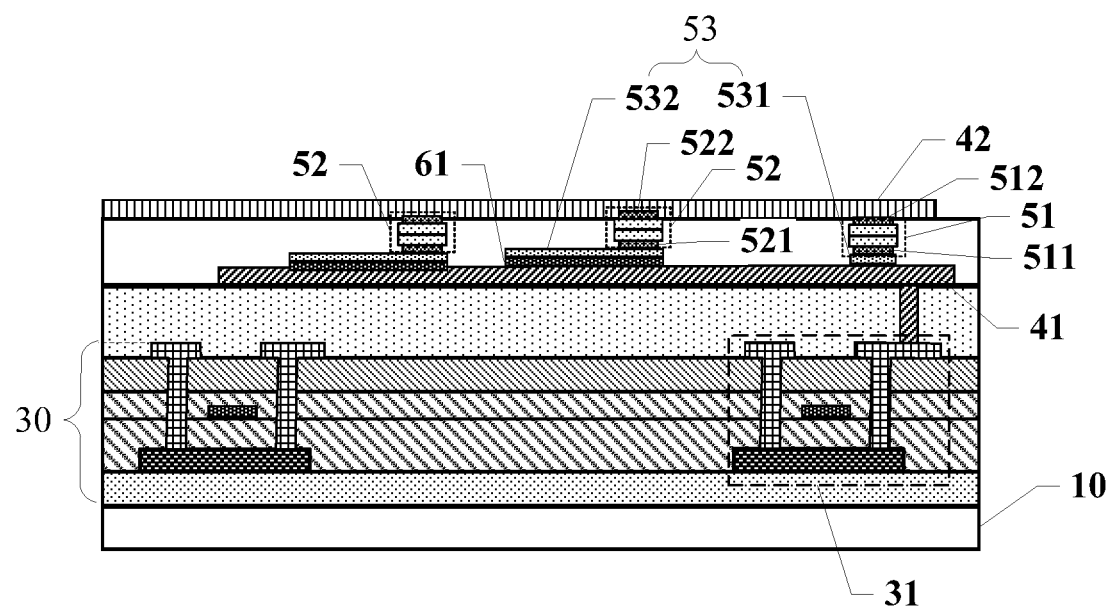
FIG. 9 illustrates a cross-section view of another exemplary structure of the display panel in FIG. 1 along an AA' direction.
Figure 10:
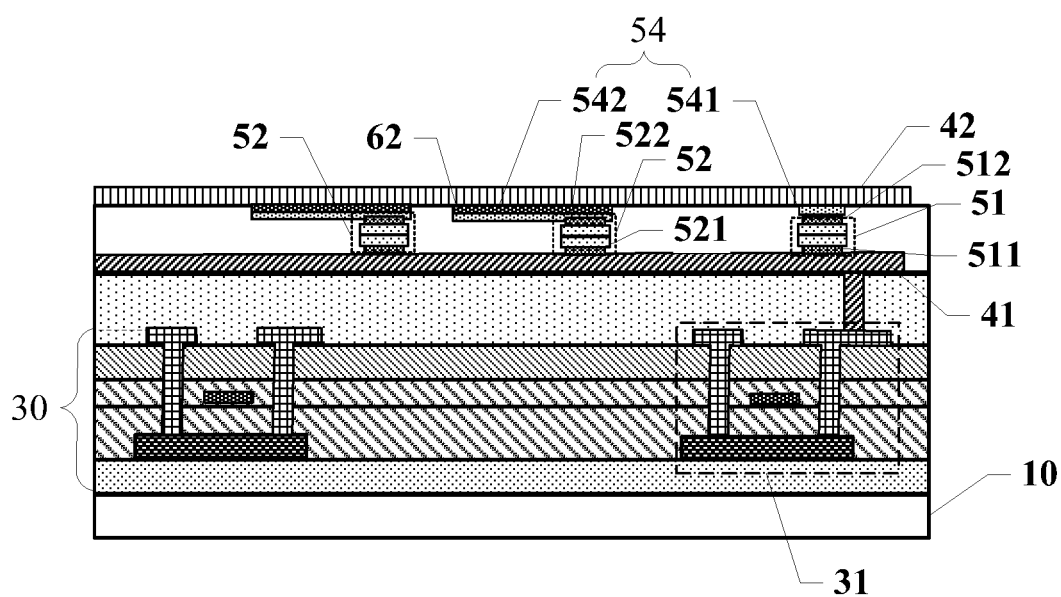
FIG. 10 illustrates a cross-section view of another exemplary structure of the display panel in FIG. 1 along an AA' direction.

FIG. 9 illustrates a cross-section view along an A-A' direction for another structure of the display panel in FIG. 1 consistent with various embodiments of the present disclosure. FIG. 10 illustrates a cross-section view along an A-A' direction for another structure of the display panel in FIG. 1 consistent with various embodiments of the present disclosure. In the display panel in FIG. 9 and FIG. 10, each sub-pixel unit of the plurality of the sub-pixel units may include one first light-emitting diode 51 and two second light-emitting diodes 52, and other aspects of the display panel may be as same as previous embodiments. When the first light-emitting diode 51 has a problem and cannot emit light normally, the laser irradiation process may be used to electrically connect one of the two second light-emitting diodes 52 with the corresponding first electrode of the plurality of the first electrodes 41 and with the second electrode 42 respectively. Subsequently, this second light-emitting diode 52 may substitute the abnormal first light-emitting diode 51 to emit light. When one of the second light-emitting diodes 52 cannot emit light normally, the laser irradiation process may be used to make another second light-emitting diode 52 substituting the abnormal first light-emitting diode 51 and the abnormal second light-emitting diode 52 to emit light. A process for repairing the sub-pixel units 21 may be simplified, and a success rate of repair the sub-pixel units 21 may be improved. A cost for the display panel may be reduced.

The present disclosure also provides a repair method for the display panel consistent with various embodiments of the present disclosure. A structure of the display panel is illustrated in FIG. 1, FIG. 2 and FIG. 6. The display panel 100 may include a display area 11 and a non-display area 12. A plurality of pixel units 20 may be deployed in the display area 11, and each pixel unit 20 may include a plurality of sub-pixel units 21.

The display panel 100 may include: a base substrate 10; an array substrate 30, disposed on the base substrate 10 including a plurality of driving thin film transistors 31; a plurality of first electrodes 41, disposed on a side of the array substrate 30 away from the base substrate 10; a light-emitting structure, disposed on a side of the corresponding first electrode of the plurality of the first electrodes 41 away from the base substrate 10; a second electrode 42, disposed on a side of the light-emitting structure away from the array substrate 30. The corresponding first electrode of the plurality of the first electrodes 41 on the array substrate 30 may be electrically connected to first terminals of the driving thin film transistors 31 one by one. The light emitting structure may include a plurality of first light-emitting diodes 51 and a plurality of second light-emitting diodes 52. First LED electrodes 511 of the first light-emitting diodes 51 and second LED electrodes 521 of the second light-emitting diodes 52 may be deployed close to the array substrate 30, while third LED electrodes 512 of the first light-emitting diodes 51 and fourth LED electrodes 522 of the second light-emitting diodes 52 may be deployed away from the array substrate 30. Each sub-pixel unit of the plurality of the sub-pixel units 21 may include a driving thin film transistor 31, a first light-emitting diode 51, and at least one second light-emitting diode 52. In the sub-pixel unit 21, the first LED electrode 511 of the first light-emitting diode 51 may be electrically connected to a corresponding first electrode 41 of the plurality of the first electrodes 41 and the third LED electrode 512 of the first light-emitting diode 51 may be electrically connected to the second electrode 42. An insulating layer 61 may be formed between a second LED electrode 521 of the at least one second light-emitting diode 52 and the corresponding first electrode of the plurality of the first electrodes 41, and a fourth LED electrode 522 of the at least one second light-emitting diode 52 may be electrically connected to the second electrode 42. In other embodiments, a second insulating layer 62 may be formed between the fourth LED electrode 522 of the at least one second light-emitting diode 52 and the second electrode 42, while the second LED electrode 521 of the at least one second light-emitting diode 52 may be electrically connected to the corresponding first electrode of the plurality of the first electrodes 41.

Figure 11:
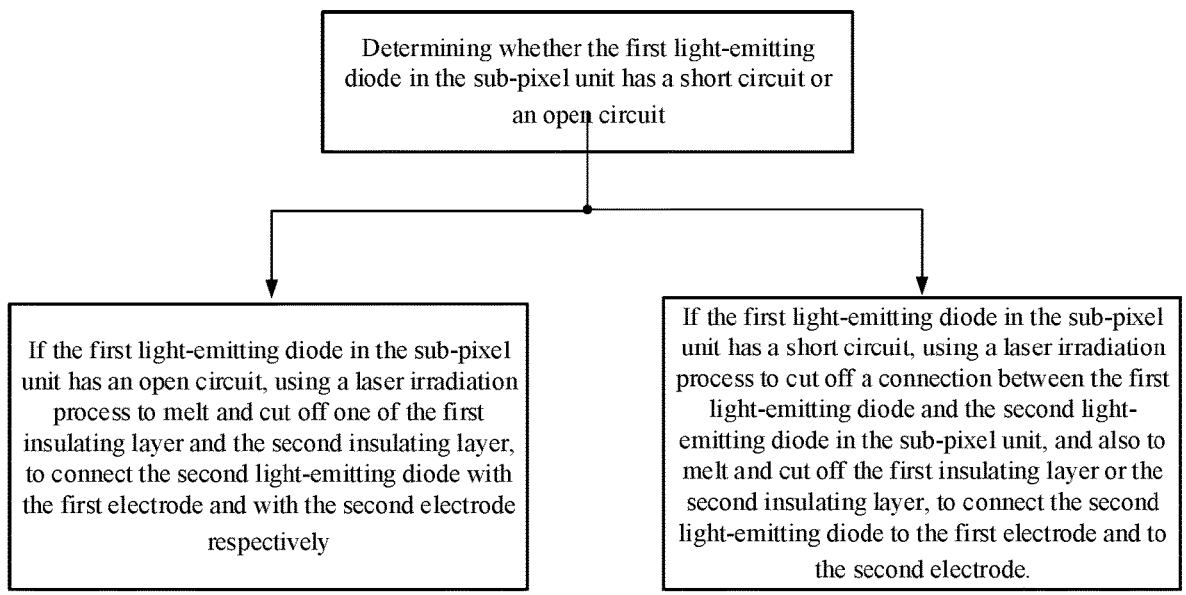
FIG. 11 illustrates an exemplary repair method of a display panel consistent with various disclosed embodiments in the present disclosure.

As illustrated in FIG. 11 the repair method for the display panel 100 consistent with various embodiments of the present disclosure may include:

determining whether the first light-emitting diode 51 in each sub-pixel unit 21 of the plurality of the sub-pixel units 21 has a shorted circuit or an open circuit;

when the first light-emitting diode 51 in the corresponding sub-pixel unit 21 has the open circuit, using a laser irradiation process to melt and cut off one of the first insulating layer 61 and the second insulating layer 62, to electrically connect the at least one second light-emitting diode 52 to the corresponding first electrode of the plurality of the first electrodes 41 and to the second electrode 42 respectively;

When the first light-emitting diode 51 in the corresponding sub-pixel unit 21 has the shorted circuit, using the laser irradiation process to disconnect the first light-emitting diode 51 and the second light-emitting diode 52 in the corresponding sub-pixel unit 21, and using the laser irradiation process to melt and cut off one of the first insulating layer 61 and the second insulating layer 62, to electrically connect the second light-emitting diode 52 to the corresponding first electrode of the plurality of the first electrodes 41 and to the second electrode 42 respectively.

As illustrated in FIG. 2 and FIG. 3, in one embodiment, in one sub-pixel unit 21, the first LED electrode 511 of the first light-emitting diode 51 and the third LED electrode 512 of the first light-emitting diode 51 may be electrically connected to the corresponding first electrode of the plurality of the first electrodes 41 and the second electrode 42 respectively. When one sub-pixel unit 21 is required to emit light, the corresponding first light-emitting diode 51 may be preferentially activated to emit light. The first insulating layer 61 may be formed between the second LED electrode 521 of the at least one second light-emitting diode 52 and the corresponding first electrode of the plurality of the first electrodes 41, and the fourth LED electrode 522 of the at least one second light-emitting diode 52 may be electrically connected to the second electrode 42. Subsequently, in an initial condition, the second light-emitting diode 52 may be not connected to the corresponding first electrode of the plurality of the first electrodes 41 and the second electrode 42. When the first light-emitting diode 51 has a problem such as an open circuit and cannot emit light normally, the laser irradiation process may be used to melt and cut off the first insulating layer 61 between the second LED electrode 521 of the second light-emitting diode 52 and the corresponding first electrode of the plurality of the first electrodes 41. Subsequently, the second LED electrode 521 of the at least one second light-emitting diode 52 may be electrically connected to the corresponding first electrode of the plurality of the first electrodes 41, and the second light-emitting diode 52 may be electrically connected to the corresponding first electrode of the plurality of the first electrodes 41 and the second electrode 42, in FIG. 3. Correspondingly the at least one second light-emitting diode 52 may be used to emit light. When the first light-emitting diode 51 cannot emit light normally because of the shorted circuit, the electrical connection between the first light-emitting diode 51 and the second light-emitting diode 52 may have to be cut off in the corresponding sub-pixel unit 21, when using the laser irradiation process to electrically connect the second light-emitting diode 52 to the corresponding first electrode of the plurality of the first electrodes 41 and the second electrode 42 in the sub-pixel unit 21.

As illustrated in FIG. 6, in each sub-pixel unit 21, the first LED electrode 511 of the first light-emitting diode 51 and the second LED electrode 521 of the at least one second light-emitting diode 52 may be both electrically connected to the corresponding first electrode of the plurality of the first electrodes 41. The second insulating layer 62, and a fourth B electrode 542 disposed on a side of the second insulating layer 62 close to the base substrate 10, may be formed between the fourth LED electrode 522 of the at least one second light-emitting diode 52 and the second electrode 42. Subsequently, initially, the first light-emitting diode 51 may be electrically connected to the corresponding first electrode of the plurality of the first electrodes 41 and the second electrode 42, while the at least one second light-emitting diode 52 may be not electrically connected to the corresponding first electrode of the plurality of the first electrodes 41 and the second electrode 42. When the first light-emitting diode 51 has a problem because of an open circuit and cannot emit light normally, a laser irradiation process may be used to irradiate a part of the second electrode 42 and the second insulating layer 62. The second insulating layer 62 may be cut off and the second electrode 42 may be electrically connected to the fourth LED electrode 522 of the at least one second light-emitting diode 52, as illustrated in FIG. 7. When the first light-emitting diode 51 cannot emit light normally because of a shorted circuit, the electrical connection between the first light-emitting diode 51 and the at least one second light-emitting diode 52 may be cut off by the laser irradiation process, when using the laser irradiation process to electrically connect the second light-emitting diode 52 to the corresponding first electrode of the plurality of the first electrodes 41 and the second electrode 42.

In the repair method for the display panel 100 provided by various embodiments of the present disclosure, when the first light-emitting diode 51 cannot emit light normally, the at least one second light-emitting diode 52 may be electrically connected to the corresponding first electrode of the plurality of the first electrodes 41 and the second electrode 42 respectively. Correspondingly the at least one second light-emitting diode 52 may substitute the abnormal first light-emitting diode 51 to emit light. A process for repairing the sub-pixel units 21 may be simplified, and a success rate of repair the sub-pixel units 21 may be improved. A cost for the display panel may be reduced.

In one embodiment, the display panel 100 may further include a third electrode 53 between the corresponding first electrode 41 of the plurality of the first electrodes 41 and the first light emitting diode 51 and the at least one second light-emitting diode 52 in each sub-pixel unit of the plurality of the sub-pixel units. The third electrode 53 may include a third A electrode 531 electrically connected to the first LED electrode 511 of the first light-emitting diode 51, and a third B electrode 532 electrically connected to the corresponding second LED electrode 521 of the at least one second light-emitting diode 52. The third A electrode 531 may be in contact with the corresponding first electrode 41 of the plurality of the first electrodes, and the first insulating layer 61 may be formed between the third B electrode 532 and the corresponding first electrode of the plurality of the first electrodes 41.

The method for using the laser irradiation process to melt one of the first insulating layer 61 and the second insulating layer 62, to electrically connect the at least one second light-emitting diode 52 to the corresponding first electrode of the plurality of the first electrodes 41 and to the second electrode 42 respectively may include: using the laser irradiation process to irradiate the third B electrode 532 and the first insulating layer 61. A part of the first insulating layer 61 irradiated by the laser may melt and evaporate, while a part of the third B electrode 532 irradiated by the laser may melt and flow into a position of the evaporated part of the first insulating layer 61 irradiated by the laser. Then the third B electrode 532 may be in contact with the corresponding first electrode of the plurality of the first electrodes 41. Subsequently, the second LED electrode 521 of the at least one second light-emitting diode 52 may be electrically connected to the corresponding first electrode of the plurality of the first electrodes 41 through the third B electrode 532.

As illustrated in FIG. 2, the first LED electrode 511 of the first light-emitting diode 51 may be electrically connected to the corresponding first electrode of the plurality of the first electrodes 51 through the third A electrode 531. Besides the first insulating layer 61, the third B electrode 532 may be formed on a side of the first insulating layer 61 away from the corresponding first electrode of the plurality of the first electrodes 41, between the second LED electrode 521 of the second light-emitting diode 52 and the corresponding first electrode of the plurality of the first electrodes 41. The third B electrode 532 may be electrically connected to the second LED electrode 521 of the second light-emitting diode 52. When the first light-emitting diode 51 has a problem and cannot emit light normally for some reasons such as an open circuit, the laser irradiation process may be used to irradiate the third B electrode 532 and the first insulating layer 61. A part of the first insulating layer 61 irradiated by the laser may melt and evaporate, while a part of the third B electrode 532 irradiated by the laser may melt and flow into a position of the evaporated part of the first insulating layer 61 irradiated by the laser, to form the electrical connection with the corresponding first electrode of the plurality of the first electrodes 41, as illustrated in FIG. 3. Subsequently, the second LED electrode 521 of the at least one second light-emitting diode 52 may be electrically connected to the corresponding first electrode of the plurality of the first electrodes 41, and the at least one second light-emitting diode 52 may be electrically connected to the corresponding first electrode of the plurality of the first electrodes 41 and the second electrode 42 respectively. Correspondingly the at least one second light-emitting diode 52 may substitute the abnormal first light-emitting diode 51 to emit light. When the first light-emitting diode 51 cannot emit light normally because of a shorted circuit, a part of the second electrode electrically connecting the first light-emitting diode 51 and the at least one second light-emitting diode 52 may be cut off by the laser irradiation process, when using the laser irradiation process to electrically connect the second light-emitting diode 52 to the corresponding first electrode of the plurality of the first electrodes 41 and the second electrode 42, as illustrated in FIGS. 4-5.

In one embodiment, the display panel 100 may further include a fourth electrode 54 between the second electrode 42 and the first light-emitting diode 51, and between the second electrode 42 and the at least one second light-emitting diode 52. The fourth electrode 54 may include a fourth A electrode 541 electrically connected to the third LED electrode 512, and a fourth B electrode 542 electrically connected to the fourth LED electrode 522. The fourth A electrode 541 may be in contact with the second electrode 42 directly, and the second insulating layer 62 may be formed between the fourth B electrode 542 and the second electrode 42.

The method for using the laser irradiation process to melt and cut off one of the first insulating layer 61 and the second insulating layer 62, to electrically connect the at least one second light-emitting diode 52 to the corresponding first electrode of the plurality of the first electrodes 41 and to the second electrode 42 respectively may include: using the laser irradiation process to irradiate the fourth B electrode 542 and the second insulating layer 62. Then the melted fourth B electrode 542 may be in contact with the corresponding first electrode of the plurality of the first electrodes 41. Subsequently, the second LED electrode 521 of the at least one second light-emitting diode 52 may be electrically connected to the second electrode 42 through the fourth B electrode 542.

As illustrated in FIG. 6, in one embodiment, in each sub-pixel unit, both the first LED electrode 511 of the first light-emitting diode 51 and the second LED electrode 521 of the at least one second light-emitting diode 52 may be electrically connected to the corresponding first electrode of the plurality of the first electrodes 41. The second insulating layer 62, and the fourth B electrode 542 on a side of the second insulating layer 62 close to the base substrate 10, may be formed between the fourth LED electrode 522 of the at least one second light-emitting diode 52 and the second electrode 42. Subsequently, initially, the first light-emitting diode 51 may be electrically connected to the corresponding first electrode of the plurality of the first electrodes 41 and the second electrode 42, while the at least one second light-emitting diode 52 may be not connected to the corresponding first electrode of the plurality of the first electrodes 41 and the second electrode 42. When the first light-emitting diode 51 has a problem and cannot emit light normally for some reasons such as an open circuit, the laser irradiation process may be used to irradiate a part of the second electrode 42 corresponding to the fourth B electrode 542. A part of the first insulating layer 61 irradiated by the laser may melt and evaporate, while a part of the second electrode 42 irradiated by the laser may melt and flow into a position of the evaporated part of the first insulating layer 61 irradiated by the laser. The melted second electrode may be in contact with the fourth B electrode 542 of the at least one second light-emitting diode 52, as illustrated in FIG. 7. Subsequently, the at least one second light-emitting diode 52 may be electrically connected to the corresponding first electrode of the plurality of the first electrodes 41 and the second electrode 42 respectively. Correspondingly the at least one second light-emitting diode 52 may substitute the abnormal first light-emitting diode 51 to emit light. A process for repairing the sub-pixel units 21 may be simplified, and a success rate of repair the sub-pixel units 21 may be improved. A cost for the display panel may be reduced. When the first light-emitting diode 51 cannot emit light normally because of a shorted circuit, the electrical connection between the first light-emitting diode 51 and the at least one second light-emitting diode 52 may be cut off by the laser irradiation process, when using the laser irradiation process to electrically connect the second light-emitting diode 52 to the corresponding first electrode of the plurality of the first electrodes 41 and the second electrode 42 by the laser radiation.

In one embodiment, using the laser irradiation process to melt and cut off the electrical connection between the first light-emitting diode 51 and the at least one second light-emitting diode 52, may include: using the laser irradiation process to irradiate the first light-emitting diode 51 to make the first light-emitting diode 51 the open circuit; or irradiating at least a part of the second electrode 42, to cut off the electrical connection between the first light-emitting diode 51 and the at least one second light-emitting diode 52 through the second electrode 42.

When cutting off the electrical connection between the first light-emitting diode 51 and the second light-emitting diode 52, a part of the second electrode 42 surrounding the first light-emitting diode 51 may be irradiated by the laser irradiation process, as illustrated in FIG. 8. Or since the first light-emitting diode 51 cannot emit light normally, the laser irradiation process may be used to irradiate and destroy the first light-emitting diode 51 directly, to make the first light-emitting diode 51 the open circuit.

Figure 12:
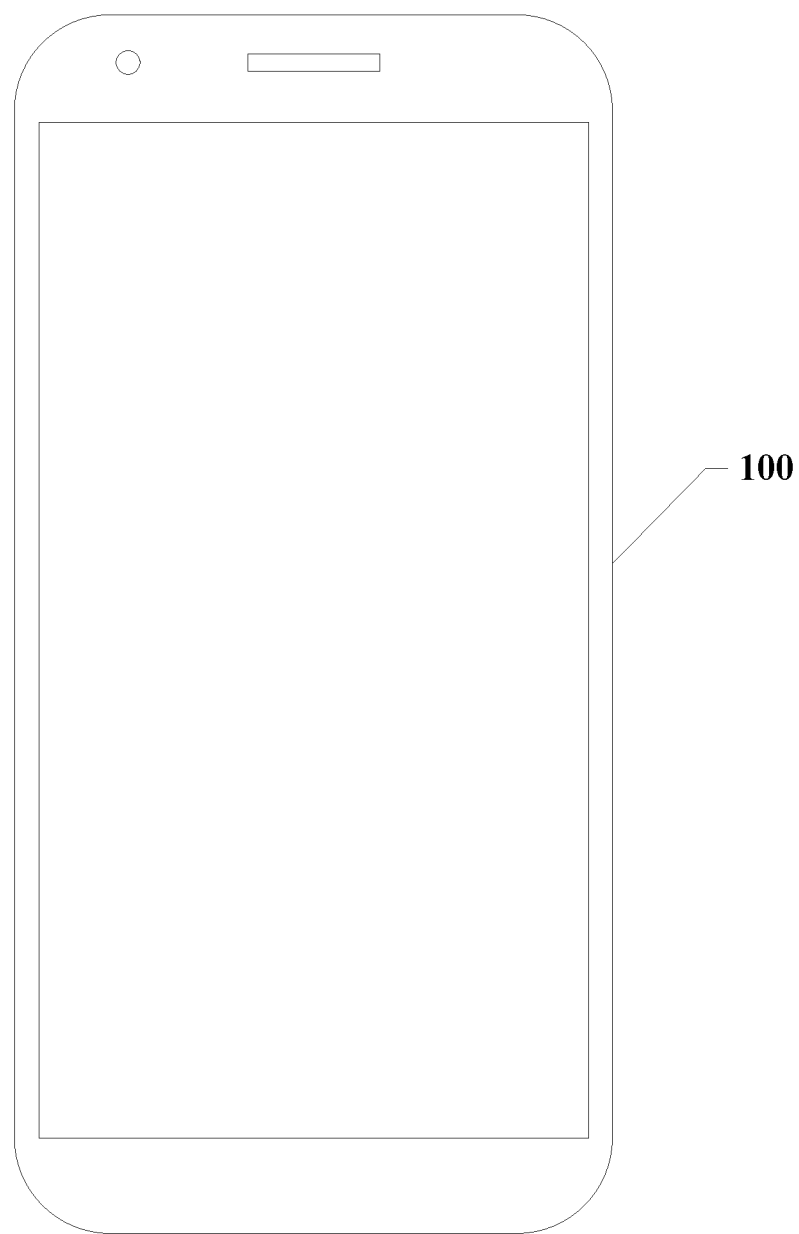
FIG. 12 illustrates an exemplary display device consistent with various disclosed embodiments in the present disclosure.

Various embodiments of the present disclosure also provide a display device. FIG. 12 illustrates a structure of a display device consistent with various embodiments of the present disclosure. The display device 200 may include a display panel 100 provided by any embodiments of the present disclosure. The display device 200 provided by the present disclosure may be any electronic products or components with a display function, including but not limited to: a cell phone, a tablet, a television, a monitor, a laptop computer, a digital photo frame, a navigator, and so on. The specification of the display panel in the display device can refer to the previous description about the various embodiments of the display panel consistent with the present disclosure.

In the present disclosure, each sub-pixel unit of the plurality of the sub-pixel units of the display panel may include a first light-emitting diode and at least one second light-emitting diode. Normally, the first light-emitting diode may emit light to display. When the first light-emitting diode cannot emit light normally, the laser irradiation process may be used to melt/cut off the first insulating layer between the second LED electrode of the second light-emitting diode and the corresponding first electrode of the plurality of the first electrodes, or to melt/cut off the second insulating layer between the fourth LED electrode of the second light-emitting diode and the second electrode. Subsequently, the second light-emitting diode may be electrically connected to the corresponding first electrode of the plurality of the first electrodes and the second electrode respectively, and can substitute the abnormal first light-emitting diode to emit light. This repairing method is simple and practical. A success rate of repair of the display panel may be improved, and a cost of the display panel may be reduced.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, configured with a display area and a non-display area surrounding the display area, the display area being configured with a plurality of pixel units, and each pixel unit including a plurality of sub-pixel units, the display panel comprising:

a base substrate;
an array substrate, disposed on the base substrate and including a plurality of driving thin film transistors;
a plurality of first electrodes, disposed on a side of the array substrate away from the base substrate, each of the plurality of first electrodes being electrically connected to a first terminals of a corresponding driving thin film transistor of the plurality of driving thin film transistors in a one-to-one correspondence;

a light-emitting structure, disposed on a side of the plurality of the first electrodes that is away from the base substrate, wherein the light-emitting structure includes a plurality of first light-emitting diodes and a plurality of second light-emitting diodes;

a second electrode, disposed on a side of the light-emitting structure away from the array substrate; and a first insulating layer electrically insulating at least one of the plurality of second light-emitting diodes from a corresponding one of the plurality of first electrodes, wherein:

first light-emitting diode (LED) electrodes of the plurality of the first light-emitting diodes and second LED electrodes of the plurality of the second light-emitting diodes are disposed adjacent to the array substrate;

third LED electrodes of the plurality of the first light-emitting diodes and fourth LED electrodes of the plurality of the second light-emitting diodes are disposed away from the array substrate;

each sub-pixel unit of the plurality of the sub-pixel units includes one of the plurality of driving thin film transistors, one of the plurality of first light-emitting diodes, and at least one of the plurality of second light-emitting diodes;

in each sub-pixel unit of the plurality of the sub-pixel units, one of the first LED electrodes of the one of the plurality of first light-emitting diodes is electrically connected to a corresponding first electrode of the plurality of first electrodes and one of the third LED electrodes of the one of the plurality of first light-emitting diodes is electrically connected to the second electrode; and the first insulating layer is formed between one of the second LED electrodes of the at least one of the plurality of second light-emitting diodes and the corresponding first electrode of the plurality of first electrodes, and one of the fourth LED electrodes of the at least one of the plurality of second light-emitting diodes is electrically connected to the second electrode.

2. The display panel according to claim 1, further including:

a fourth electrode, disposed between the second electrode and the one of the plurality of first light-emitting diodes, and between the second electrode and the at least one of the plurality of second light-emitting diodes, in each sub-pixel unit of the plurality of the sub-pixel units, wherein:

the fourth electrode includes a fourth A electrode electrically connected to a third LED electrode of the one of the plurality of first light-emitting diodes, and a fourth B electrode electrically connected to the fourth LED electrode of the at least one of the plurality of second light-emitting diodes;

the fourth A electrode is in contact with the second electrode directly; and a second insulating layer is between the fourth B electrode and the second electrode.

3. The display panel according to claim 2, wherein:

in a same sub-pixel unit of the plurality of the sub-pixel units, an area of an orthographic projection of the fourth B electrode on a plane of the base substrate and an area of an orthographic projection of the second insulating layer on the plane of the base substrate, are larger than an area of an orthographic projection of the fourth LED electrode on the plane of the base substrate.

4. The display panel according to claim 2, wherein:

the second electrode is a transparent electrode.

5. A display panel, configured with a display area and a non-display area surrounding the display area, the display area being configured with a plurality of pixel units, and each pixel unit including a plurality of sub-pixel units, the display panel comprising:

a base substrate;

an array substrate, disposed on the base substrate and including a plurality of driving thin film transistors;

a plurality of first electrodes, disposed on a side of the array substrate away from the base substrate, each of the plurality of first electrodes being electrically connected to a first terminals of a corresponding driving thin film transistor of the plurality of driving thin film transistors in a one-to-one correspondence;

a light-emitting structure, disposed on a side of the plurality of the first electrodes that is away from the base substrate, wherein the light-emitting structure includes a plurality of first light-emitting diodes and a plurality of second light-emitting diodes;

a second electrode, disposed on a side of the light-emitting structure away from the array substrate;

a first insulating layer, wherein:

first light-emitting diode (LED) electrodes of the plurality of the first light-emitting diodes and second LED electrodes of the plurality of the second light-emitting diodes are disposed adjacent to the array substrate;

third LED electrodes of the plurality of the first light-emitting diodes and fourth LED electrodes of the plurality of the second light-emitting diodes are disposed away from the array substrate;

each sub-pixel unit of the plurality of the sub-pixel units includes one of the plurality of driving thin film transistors, one of the plurality of first light-emitting diodes, and at least one of the plurality of second light-emitting diodes;

in each sub-pixel unit of the plurality of the sub-pixel units, one of the first LED electrodes of the one of the plurality of first light-emitting diodes is electrically connected to a corresponding first electrode of the plurality of first electrodes and one of the third LED electrodes of the one of the plurality of first light-emitting diodes is electrically connected to the second electrode; and the first insulating layer is formed between one of the second LED electrodes of the at least one of the plurality of second light-emitting diodes and the corresponding first electrode of the plurality of first electrodes, and one of the fourth LED electrodes of the at least one of the plurality of second light-emitting diodes is electrically connected to the second electrode; and a third electrode, disposed between the one of the plurality of first light-emitting diodes and the corresponding first electrode, and between the at least one of the plurality of second light-emitting diodes and the corresponding first electrode, in each sub-pixel unit of the plurality of the sub-pixel units, wherein:

the third electrode includes a third A electrode electrically connected to the first LED electrode of the one of the plurality of first light-emitting diodes and a third B electrode electrically connected to the second LED electrode of the at least one of the plurality of second light-emitting diodes, the third B electrode being located between the first insulating layer and the second LED electrode of the at least one of the plurality of second light-emitting diodes;

the third A electrode is in contact with the corresponding first electrode; and the first insulating layer is between the third B electrode and the corresponding first electrode.

6. The display panel according to claim 5, wherein:

in a same sub-pixel unit of the plurality of the sub-pixel units, an area of an orthographic projection of the third B electrode on a plane of the base substrate and an area of an orthographic projection of the first insulating layer on the plane of the base substrate, are larger than an area of an orthographic projection of the second LED electrode on the plane of the base substrate.

7. The display panel according to claim 5, wherein:

both the second electrode and the third B electrode are transparent electrodes.

8. The display panel according to claim 5, wherein the second electrode is a full-surface electrode corresponding to the display area.

9. A display device, comprising:

a display panel, configured with a display area and a non-display area surrounding the display area, the display area being configured with a plurality of pixel units, and each pixel unit including a plurality of sub-pixel units, the display panel comprising:

a base substrate;

an array substrate, disposed on the base substrate and including a plurality of driving thin film transistors;

a plurality of first electrodes, disposed on a side of the array substrate away from the base substrate, each of the plurality of first electrodes being electrically connected to a first terminals of a corresponding driving thin film transistor of the plurality of driving thin film transistors in a one-to-one correspondence;

a light-emitting structure, disposed on a side of the plurality of the first electrodes that is away from the base substrate, wherein the light-emitting structure includes a plurality of first light-emitting diodes and a plurality of second light-emitting diodes;

a second electrode, disposed on a side of the light-emitting structure away from the array substrate; and a first insulating layer electrically insulating at least one of the plurality of second light-emitting diodes from a corresponding one of the plurality of first electrodes, wherein:

first light-emitting diode (LED) electrodes of the plurality of the first light-emitting diodes and second LED electrodes of the plurality of the second light-emitting diodes are disposed adjacent to the array substrate;

third LED electrodes of the plurality of the first light-emitting diodes and fourth LED electrodes of the plurality of the second light-emitting diodes are disposed away from the array substrate;

each sub-pixel unit of the plurality of the sub-pixel units includes one of the plurality of driving thin film transistors, one of the plurality of first light-emitting diodes, and at least one of the plurality of second light-emitting diodes;

in each sub-pixel unit of the plurality of the sub-pixel units, one of the first LED electrodes of the one of the plurality of first light-emitting diodes is electrically connected to a corresponding first electrode of the plurality of first electrodes and one of the third LED electrodes of the one of the plurality of first light-emitting diodes is electrically connected to the second electrode;

the first insulating layer is formed between one of the second LED electrodes of the at least one of the plurality of second light-emitting diodes and the corresponding first electrode of the plurality of first electrodes, and one of the fourth LED electrodes of the at least one of the plurality of one second light-emitting diodes is electrically connected to the second electrode.

10. The display device according to claim 9, further including:

a third electrode, disposed between the one of the plurality of first light-emitting diodes and the corresponding first electrode, and between the at least one of the plurality of second light-emitting diodes and the corresponding first electrode, in each sub-pixel unit of the plurality of the sub-pixel units, wherein:

the third electrode includes a third A electrode electrically connected to the first LED electrode of the one of the plurality of first light-emitting diodes and a third B electrode electrically connected to the second LED electrode of the at least one of the plurality of second light-emitting diodes;

the third A electrode is in contact with the corresponding first electrode; and the first insulating layer is between the third B electrode and the corresponding first electrode.

11. The display device according to claim 9, wherein:

in a same sub-pixel unit of the plurality of the sub-pixel units, an area of an orthographic projection of the third B electrode on a plane of the base substrate and an area of an orthographic projection of the first insulating layer on the plane of the base substrate, are larger than an area of an orthographic projection of the second LED electrode on the plane of the base substrate.

12. The display device according to claim 9, wherein:

both the second electrode and the third B electrode are transparent electrodes.

13. The display device according to claim 9, wherein the second electrode is a full-surface electrode corresponding to the display area.

* * * * *